United States Patent
Gupta et al.

(10) Patent No.: US 10,867,106 B1
(45) Date of Patent: Dec. 15, 2020

(54) ROUTING FOR LENGTH-MATCHED NETS IN INTERPOSER DESIGNS

(71) Applicant: Synopsys, Inc., Mountain View, CA (US)

(72) Inventors: Jitendra Kumar Gupta, Sunnyvale, CA (US); Ksenia Roze, Durham, NC (US); Xun Liu, Durham, NC (US); Paul Chang, Mountain View, CA (US); Lan Luo, Mountain View, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/749,807

(22) Filed: Jan. 22, 2020

Related U.S. Application Data

(60) Provisional application No. 62/795,111, filed on Jan. 22, 2019.

(51) Int. Cl.
*G06F 30/3953* (2020.01)

(52) U.S. Cl.
CPC ............... *G06F 30/3953* (2020.01)

(58) Field of Classification Search
USPC .................................................. 716/137
See application file for complete search history.

(56) References Cited

U.S. PATENT DOCUMENTS

2018/0157782 A1   6/2018   Rossi et al.

*Primary Examiner* — Mohammed Alam
(74) *Attorney, Agent, or Firm* — Fenwick & West LLP

(57) ABSTRACT

Automated routing of signal nets for interposer designs. Signal nets are defined by their endpoints (bumps). The nets and their corresponding bumps are assigned to bump groups, based on the relative locations of the bumps and also based on length-matching constraints for the nets. Some of the bump groups may be "clones," where the routing for one bump group may also be applied to its clone. In order for two bump groups to be clones, the bumps in the two bump groups must have a same relative position (i.e., same bump pattern), and the nets in the two bump groups must be subject to the same length-matching constraint. The routing through the interposer for one of the clones is determined, and that routing is then replicated for the other clones.

20 Claims, 5 Drawing Sheets

ROUTING FOR LENGTH-MATCHED NETS IN INTERPOSER DESIGNS

CROSS-REFERENCE TO RELATED APPLICATION(S)

This application claims priority under 35 U.S.C. § 119(e) to U.S. Provisional Patent Application Ser. No. 62/795,111, "Automated Routing Methodology for Extremely Dense, Length Matched, Coaxially Shielded Routes in Interposer Designs," filed Jan. 22, 2019. The subject matter of all of the foregoing is incorporated herein by reference in their entirety.

BACKGROUND

1. Technical Field

This disclosure relates generally to the field of electronic design and, more particularly, to automated routing of interposer designs.

2. Description of Related Art

Interposer designs are a category of 3DIC integration designs, where two or more "top dies" (i.e., die with functional circuitry) are placed on an "interposer die" to realize the full system design. Top dies can be CPUs, high bandwidth and other types of memory, FPGA, or any other digital/analog IC implementation. Interposer is usually a larger geometry technology node with primary purpose of providing die-to-die connectivity and die-to-package connectivity. Given the complexity of top dies and the overall system, the interposer connectivity requirements can be very complex.

Current standalone routers typically cannot meet the requirements for interposer routing. Specifically, existing routers often have limited capability to handle customized design rules such as routing patterns and complex layer restrictions. They may not identify routing patterns and typically do not duplicate routing results for signal nets with identical patterns. Therefore, extremely long runtime is typically needed. In addition, rip-up and reroute strategy adopted by existing routers will unlikely to work when route track utilization is close to 100%, as is not uncommon with interposers.

Existing CPU-HBM routing methodologies as discussed in Automated Place-and-Route Method for HBM-based IC devices" Patent Pub. #2018/0157782 by Rossi et al are based on manual design of pre-route "escape tiles". Such pre-routed escape tile designs are specific to an underlying interposer technology, wire width and spacing rules, shielding rules, layer assignment, route orientation and so on. Further, the user must understand and implement all routing requirements during the manual design of the escape tile, because routing from edge of one escape tile to the other escape tile is primarily straight line routes. Hence, such manual method is both labor-intensive and difficult to re-use.

Thus, there is a need for better approaches to routing signal nets through interposers.

SUMMARY

The present disclosure overcomes the limitations of the prior art by providing an automated approach for routing signal nets through an interposer die. A multichip module comprises a plurality of "top die" containing circuitry to be interconnected through an interposer die. The design for the multichip module specifies the following: the locations of bumps on an RDL layer of the interposer, where the bumps will connect to the top die; the logical nets to be routed through the interposer, where the endpoints of each net are two of the bumps on the RDL layer of the interposer; and one or more length-matching constraints, where a length-matching constraint specifies that two or more of the nets must be length-matched.

The nets (and their corresponding bumps) are assigned to bump groups, based on the relative locations of the bumps and also based on the length-matching constraints. Some of the bump groups may be "clones," where the routing for one bump group may also be applied to its clone. In order for two bump groups to be clones, the bumps in the two bump groups must have a same relative position (i.e., same bump pattern), and the nets in the two bump groups must be subject to the same length-matching constraint. The routing through the interposer for one of the clones is determined, and that routing is then replicated for the other clones.

Other aspects include components, devices, systems, improvements, methods, processes, applications, computer readable mediums, and other technologies related to any of the above.

BRIEF DESCRIPTION OF THE DRAWINGS

Embodiments of the disclosure have other advantages and features which will be more readily apparent from the following detailed description and the appended claims, when taken in conjunction with the examples in the accompanying drawings, in which:

DETAILED DESCRIPTION OF THE PREFERRED EMBODIMENTS

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Figure 1A:
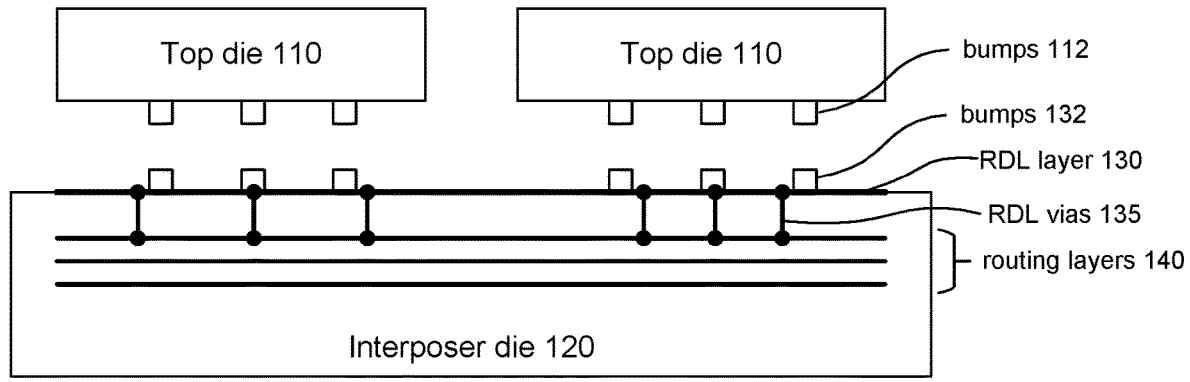
FIG. 1A is an exploded cross-sectional view of a multi-chip module containing top die interconnected through an interposer die.
Figure 1B:
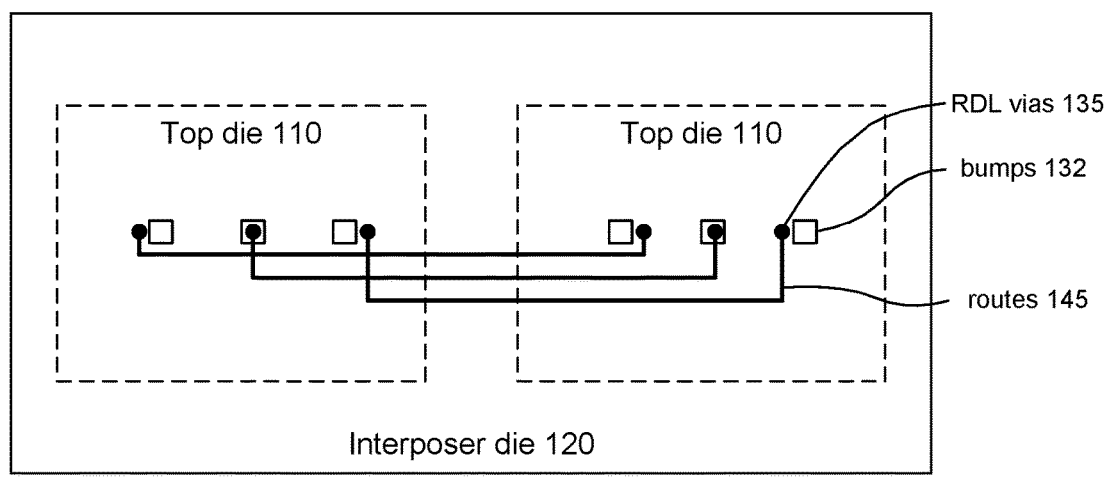
FIG. 1B is a top view of the interposer die of FIG. 1A.

FIG. 1A is an exploded cross-sectional view of a multi-chip module containing top die 110 interconnected through an interposer die 120. FIG. 1B is a top view of the interposer die 120. The top die 110 contain circuitry. In FIG. 1, the multichip module contains an array of top die that are all the same. Examples of top die include high bandwidth memories, FPGAs, and processor die. Various types of GPUs, CPUs, TPUs (tensor processing units), application processors, image processors, AI processors, image sensors and other types of top die may also be used, particularly if the architecture is scalable. The bottom side of the interposer die 120 may be used to connect to packaging (not shown).

The interposer die 120 includes a redistribution layer (RDL layer) 130 and multiple routing layers 140. The RDL layer 130 contains "bumps" 132, which make electrical contact to corresponding bumps 112 on the top die 110. For convenience, all of these contacts will be referred to as "bumps," but they are not limited to bump technology. The location of the bumps 132 on the RDL layer are typically defined by the location of the corresponding bumps 112 on the top die 110. RDL vias 135 connect the top RDL layer 130 with the lower routing layers 140. Most of the interconnect routing occurs in the routing layers 140. Typically, the routing layers are metal layers with defined tracks, and routing through the interposer is along the tracks. FIG. 1B shows the routing 145 of three nets between three pairs of bumps. The RDL layer 130 is not shown in FIG. 1B. Different routing layers 140 may be dedicated to different preferred directions (e.g., primarily vertical or horizontal tracks). For example, the horizontal legs of the routes 145 may be along horizontal tracks in one routing layer, and the vertical legs may be along vertical tracks in a different routing layer, with non-RDL vias connecting the different legs.

Interposer connectivity is defined by nets to be routed through the interposer. In the following disclosure, signal nets are nets that carry signals, such as data or control signals, rather than power or ground. Each signal net connects two of the bumps on the RDL layer of the interposer. However, this is done for purposes of explanation, and the principles described are not limited to these types of nets. In addition, the signal nets may be intra-die nets (i.e., between two bumps for the same top die) or inter-die nets (i.e., between bumps for two different top die).

Interposer connectivity often has the following characteristics:

Many inter-die signal nets. For many interposers, it is not unusual for a majority of the signal nets to be inter-die nets. Inter-die nets typically are also longer. For example, in some cases, a majority of the routing in the interposer have lengths that are at least 50% of the die width, say 10 mm for 20 mm wide die.

Very dense routing. There is a very large number of routes to implemented—to the extent that almost all interposer area is used by signal routing, PG (power ground) routing and shielding. In other words, the ratio of routes to be implemented to the number of routes possible is almost 100 percent, for example 90 percent or 95 percent or more.

Length-matched routes. In many cases, almost all or a significant subset of die-to-die nets has length-matching requirement, for example 50 percent or 90 percent or more of the signal nets may have length matching constraint. Two nets are length-matched if the routing between their endpoints has the same length (although the lengths may not be exactly the same, for example to accommodate power-ground straps or different spacings between die). Same wire-length roughly translates to approximately zero or minimum skew delay for die-to-die interface.

Co-axial shielding. Given the length of wires in die-to-die connectivity, signal integrity requirements often dictate that all signal routes be shielded on all four sides. This means shielding on both sides of metal layer used for routing as also on metal layer track both directly above and directly below the signal route.

Minimum number of via and route jogs. The interposer die may be very large, up to several 10s of top-die size. Hence, to maintain high interposer yield, it is preferred to minimize number of vias used as well as average number of jogs per route. For this reason, single-layer routing is preferred for vast majority of interposer routes. Preferably 90 percent or more of signal nets will be routed on a single layer (excluding jumpers).

Figure 2:
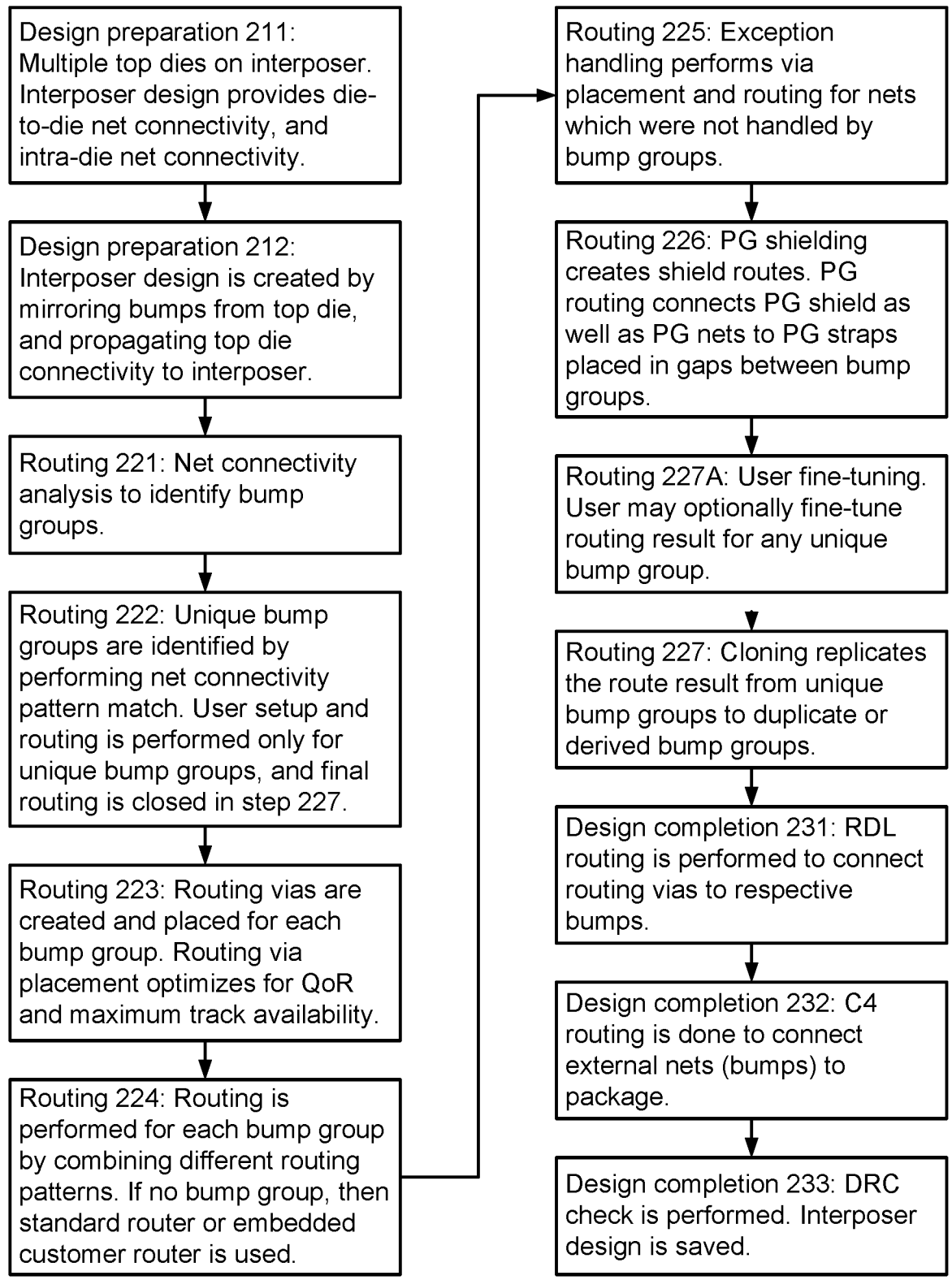
FIG. 2 provides a description of routing methodology steps.

FIG. 2 provides a description of routing methodology steps. Steps 22*x* concern the actual routing of signal nets through the interposer die. Steps 21*x* are preparatory steps. Steps 23*x* are post-design steps.

The main steps 22*x* in this routing methodology are as below:

Step 221.

Net connectivity analysis for identification of routing bump groups for horizontal, vertical, horizontal offset or vertical offset routes. This step is important to maximize track utilization because a solution may be possible only when every possible track is utilized.

Step 222.

Identification of unique bump groups by connectivity pattern matching. This reduces overall interposer routing problem to a sequence of much smaller sized and unique problems. This may have the following benefits: (i) routing solution can be found in very quick elapse time, (ii) user can specify routing requirements and restriction in context of these unique bump groups, and (iii) user can fine-tune computed result in context of these unique bump groups. Methodology can later replicate the final routing result automatically to hundreds or thousands of duplicate and/or similar bump groups (referred to as clones).

Step 223.

RDL via creation and placement. Top die interface to interposer provides location of bumps on RDL layer. Bumps on RDL layer connect to underlying metal routing layers through so-called "RDL via" objects. Placement of RDL via is important to achieve successful routing result. Sub-optimal RDL via placement may cause some tracks to be wasted, resulting in no routing solution is possible.

Step 224.

Routing for each unique bump group. Interposer routing is determined for each unique bump group, by applying tool-generated sequence of specialized routing algorithms, for example river route pattern, loop-back pattern, vertical/horizontal U-pattern, twin-track hybrid trunk pattern and various jumper patterns. Because of prior identification of unique bump groups, it is possible to evaluate and apply these algorithms individually on each unique bump group with very small compute time.

Step 225.

Exception handling. Given interposer complexity, there are sometimes a very few routes where a legal solution cannot be found while honoring all user constraints. Methodology allows user to control which constraint can be relaxed, say co-axial shielding constraint, and to what extent, say number of nets violating this constraint and maximum length of route that constraint may be violated.

Step 226.

PG Shielding and PG routing. This step is performed based on routing solution found in prior steps. Shield routes are reserved in prior steps so that shielding can be performed without affecting signal routes already created. Similarly, each routing bump group may allocate required area for PG/C4 hookup (to packaging) at time of identifying routing bump group and placing via for top-die connectivity.

Step 227.

Cloning. This step applies routing solution computed for unique bump groups to all similar and/or derived bump groups (i.e., to clone bump groups). In addition to applying the routing solution, methodology allows user to fine-tune (or touch-up) tool-generated routing solution. In one approach, the route cloning steps will replicate all of user updates also to the other clone bump groups.

These steps can be combined with existing standalone routers. Specifically, they can be applied on different portions of the design or applied consecutively on the same portion of the design. In addition, not all steps need be performed and additional steps may be added to the overall flow.

This section describes individual steps in the automated routing methodology for interposer designs in more detail, including pre- and post-routing steps.

Step 211: Design Preparation (Top Die)

The multichip module includes multiple top die placed on an interposer die. The interposer provides connectivity between bumps on the top die. The nets routed through the interposer may be die-to-die (inter-die nets) or intra-die nets.

Step 212: Design Preparation (Bump Locations)

Bump locations on the top die are mirrored to the interposer on the RDL layer. This gives the locations of the endpoints of the nets to be routed through the interposer. The top-die connectivity is propagated to the interposer. This specifies which bumps are the endpoints for which nets. Other constraints, such as length-matching constraints on nets, may also be propagated to the interposer design.

Step 221: Net Connectivity Analysis for Identification of Bump Groups

This step in interposer routing includes correct identification of all route sections. In initial analysis, only 2-pin nets connecting the RDL layer bumps are analyzed. All 2-pin nets are classified into one of the following four route types based on their orientation:

Horizontal routes—These routes are oriented dominantly horizontal. That is, vertical offset between two endpoints is significantly smaller than their horizontal offset. Two bump endpoints which are connected through a horizontal route are said to belong to the same horizontal bump group. After all horizontal routes have been identified, the horizontal routing is used to partition all bumps into a distinct set of horizontal bump groups such that there is no horizontal connectivity across two horizontal bump groups. In other words, all horizontal connectivity is self-contained in each horizontal bump group. If there is a small number of 2-pin nets which prevent horizontal bump group identification, these may be ignored, and post-processed as described later in this section.

Vertical routes—These routes are similar to horizontal routes except that connectivity is oriented predominantly along vertical dimension. Identification of vertical bump groups is performed similar to those for horizontal bump groups. It should be noted that any given bump will connect either horizontally, or vertically, or one of the other cases described below.

Offset horizontal routes—These routes are similar to horizontal routes, but the endpoints have some nontrivial vertical offset. Hence, the route can be visualized as consisting of three sub-sections: a) left horizontal sub-section, b) a diagonal sub-section to account for the vertical offset, and c) a right horizontal sub-section.

Note the length matching and co-axial shielding requirements typically will apply to all three subsections of route topology.

Offset vertical routes—These routes are similar to vertical routes but with some horizontal offset. Hence, the route can be visualized as consisting of three sub-sections: a) top vertical sub-section, b) a diagonal sub-section to account for the horizontal offset, and c) a bottom vertical sub-section.

Other route types may also be used. Two examples are 45-degree routes that connect a bottom left endpoint to a top right endpoint, and 135-degree routes that connect a bottom right endpoint to a top left endpoint.

Nets and their endpoint bumps are classified into bump groups. In one approach, all nets in a bump group must have the same directional orientation (e.g., all horizontal routes), all nets must be subject to the same length-matching constraint, and the bumps and nets must be in close proximity to each other. Examples of bump groups include data buses connecting memories, CPUs, GPUs, TPUs, image processors, AI processors, image sensors or other die with scaled architecture. Bump groups represent interposer connectivity patterns that may be repeated on the multichip module. Bump groups may have at least 10 signal nets (20 bumps), or at least 100 signal nets or even more.

Typically, a large majority of bump-to-bump connectivity nets are classified in one of the above cases. A small number of unclassified nets may be left for post-processing. During post-processing, remaining nets are analyzed to see if these can be realized in the context of the above identified route types. A few examples of such post-processing cases are as below:

An unhandled 2-pin net is analyzed to check if it can be implemented as a pair of a vertical route and a horizontal route within context of a previously identified horizontal bump group and vertical bump group.

An unhandled 3-pin net is represented as a pair of 2-pin nets based on relative topology of the three endpoints.

In case of interposers where no bump groups can be identified, the methodology may perform interposer routing using any of existing standalone routers or the embedded custom router. Nets connecting 2 bumps are routed generally along the fly line direction of connection. Multiple standalone routers or the embedded custom router can be used consecutively to complete the routing using both user specified routing patterns or automatically generated routing patterns. Users can place vias and routes to complete the entire routing. Or user can place vias and use these vias to guide a standalone router to connect the entire net. User can also route a fraction of the net and place vias on existing routes and then complete the routing using the same or different routers.

There are various interposer design style depending on both foundry technology and 3DIC design characteristics and requirement. Certain embodiments can be made applicable to different designs and technology by utilizing a user pattern file. For example, the pattern file for XPU-HBM interposer may contain five major sections. The first section provides user capability to overwrite design rules. Although the tool can load design rules from the technology file, this section gives user a way to introduce more stringent design rule requirement on routing and via placement. The second section of the pattern file defines routing configurations. User can specify layer selection or routing patterns for any nets. The third section specifies the locations of RDL vias. User can choose exact locations of vias or force via alignment either horizontally or vertically. The fourth section of pattern file allows users to select portion of designs to work. User can either use design fraction based on their knowledge or rely on our analysis capability to identify net groups. Various groups can be designed in different styles. Fifth part of pattern file allows users to provide detailed instruction to exception handling.

As another example, the pattern file for FPGA interposer may contain additional information in four major sections. First section identifies horizontal and vertical wire length or bump-to-bump gap, and hence, helps determine whether river route or loopback routes topology may be used for a given bump-pair connection. Second section guides "RDL via" placement such that track loss due to RDL via overlap is minimized, and structured horizontal and vertical routes can be implemented for all bump groups. Third section helps to create required number of tracks for each bump group routing or select from existing tracks if user has created tracks. Fourth section guides tool to select route topology and layer assignment when more than one routing solution may be feasible.

Step 222: Identification of Unique Bump Groups

Some bump groups may be clones of each other. In that case, the routing determined for one bump group (the "unique" or representative bump group) may also be applied to all its clones. In one approach, all nets in a bump group must be subject to a same length-matching constraint. In order for two bump groups to be clones, the bumps in one bump group must have the same relative position and net connectivity as the bumps in the other bump group, and both bump groups must be subject to the same length-matching constraint. There may also be additional requirements. For example, both bump groups may be required to have the same track availability for routing the nets in the bump group. This way, the routing pattern determined for one bump group may also be applied to the other clone bump groups.

Identification of unique (aka, representative) bump groups may provide benefits such as the following:

Reduce time to results, possibly by order of 100× to 1000×. In large interposer design, a given connectivity pattern (i.e., bump group) may be repeated hundreds to thousands of times. By identifying such repeat patterns (clones) up front, this methodology enables re-use of routing solution from a unique bump group to all its duplicate or derived bump groups. In case of duplicate bump groups, the via placement is identical, and hence routes can be cloned. In case of derived bump groups, the connectivity pattern is same, but via-placement may not be exactly same. In such case, routing engine legalizes the route-solution of unique bump group by aligning with new via locations.

Number of unique bump groups is much fewer. This allows user to specify bump group-specific constraints and preferences more easily. Examples of such user input are: a) preferred/maximum number of tracks to be used on each layer, b) preferred layer assignment pattern, c) control of greedy vs. non-greedy track assignment, d) priority order for net routing, etc. Some of these may be very important. For example, if routing solution is not feasible for all nets, then net priority order determines which nets get priority on available tracks, and hence, which tracks are left unrouted and handled by subsequent algorithm such as twin-track assignment.

After routing engine completes routing for all unique bump groups, user is still able to fine-tune routes based on functional, test or power consideration. After user fine-tuning, the revised routing result is cloned to all clone bump groups.

In one approach, the routing methodology identifies unique bump groups on following two aspects.

First, it compares the bump-to-bump connectivity pattern between a unique bump group and candidate bump group. This pattern is identified as a canonical signature computed from a) the row and column placement of each connected bump-pair, and b) the length-matched topology of bump-connection—whether it is a direct connection, loop-back connection, or a measured detour connection. If a candidate bump group's full signature does not match that of any pre-identified unique bump group, each such candidate is marked as another unique bump group.

If canonical signature exactly matches, then routing flow compares non-RDL via placement. If non-RDL via placement matches, such candidate bump group is marked as a duplicate (clone) bump group of a given unique bump group.

If non-RDL via placement differs only in coordinate location, but not relative order and edge of the bump group, the candidate bump group is identified as a derived bump group. If none of above two conditions are matched, then the candidate bump group is marked as unique bump group.

Step 223: RDL Via Creation and Placement

In interposer routing, the placement of via connecting the top metal routing layer of the interposer to the RDL layer is important. All non-RDL layer routes see only this via location as the rest of RDL routing as well as the RDL layer bump itself do not interfere with metal routing. In this document, this via is referred to as the RDL via.

Placement of RDL via may be done taking the following constraints into account:

Maximize the single layer route patterns—An important criterion in routing each bump group is to maximize the feasibility of single layer routes such as river routes or loopback routes, and hence, minimize the number of vias used and number of jogs used. This is achieved by placing RDL via to facilitate preferred route patterns.

Maximize track availability—Placement of RDL via obstructs underlying non-RDL tracks. Hence, placement of adjacent RDL vias is aligned to use same track and hence, minimize the total number of tracks obstructed. In addition, placement algorithm also shares the track used by adjacent bump groups, effectively reducing the number of obstructed tracks by as much as 50 percent.

Alignment of horizontal bump group RDL vias and vertical bump group RDL vias—In interposer 2-pin routing, typically each RDL via is used either for horizontal routing or vertical routing, but not both. Hence, the RDL placement of horizontal bump groups is done concurrently with those of overlapping vertical bump groups. The 45-degree and 135-degree bump groups are covered by horizontal and vertical bump group RDL via placement because in former cases, the 45-degree bend and 135-degree bend sub-section does not usually contain any RDL via, and all RDL via occur only in the horizontal or vertical sub-section of those bump groups.

The following are three possible methods for RDL via placement.

First is the fully automated method. In such case, algorithm evaluates placement of RDL via on either single edge of both edges of each horizontal or vertical bump group. A solution which maximizes the number of single layer routes, while minimizing the total number of tracks obstructed is selected.

Second is the user-specified offset specification method. In such case, user controls the offset from bump location in context of each horizontal and/or vertical bump group.

In third method, user can place RDL via using their design-specific or proprietary scripts while using standard RDL via creation commands. Automated methodology allows partial or complete pre-placement of RDL via by the user. All pre-placements serve as user constraints for subsequent routing flow.

After RDL via has been placed (or pre-placed by user), the routing methodology will identify on-track location for placement of corresponding non-RDL vias.

Step 224: Automatic Routing for Each Unique Bump Group

After unique bump groups have been identified, routing methodology applies its internal suite of specialized routing algorithms to each unique bump group. The interposer routing engine is initialized with following information:

User-input constraint and guidance for each unique bump group. Such input may specify a) preferred/maximum number of tracks to be used on each layer, b) preferred layer assignment pattern, c) control of greedy vs. non-greedy track assignment, d) priority order for net routing, etc.

Non-RDL via placement is analyzed to identify the complete span of tracks available for routing. Note user input may limit maximum number of tracks that can be used on any given layer, spare tracks required for non-signal and non-handled routes, and other similar input. Such input may be specified separately for each unique bump group.

Figure 3A:
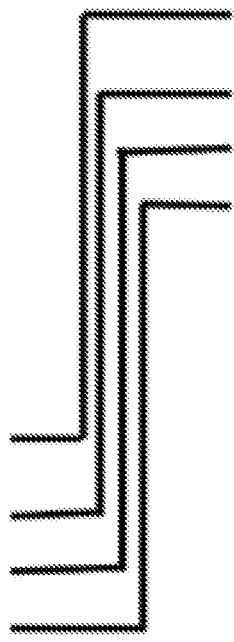
FIGS. 3A-3D are top views of length-matched routing templates based on different routing patterns.
Figure 3B:
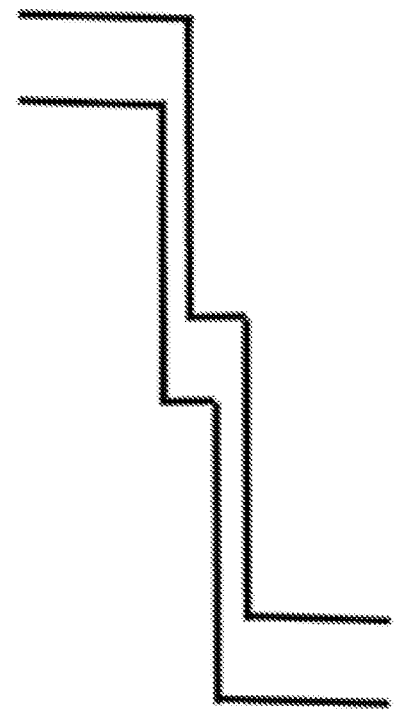
Figure 3C:
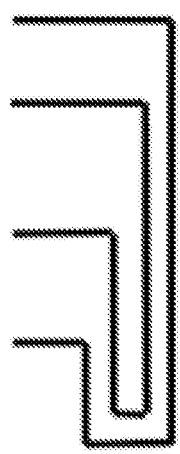
Figure 3D:
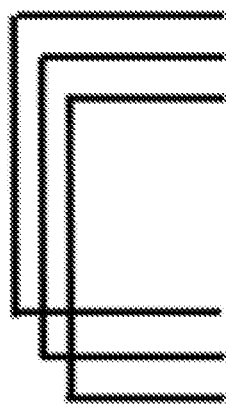

Given the nature of each routing engine's built-in recipe, it will select from a set of predefined routing templates that satisfy the length-matching constraint (i.e., all routes in the template have the same length). As shown in FIG. 3, examples of such routing templates include those based on single layer loopback routing (FIG. 3A), single layer river-routing (FIG. 3B), orthogonal U-turn pattern (FIG. 3C, which is single layer but uses short jumpers to avoid shorts), and twin-track routing (FIG. 3D). FIG. 3D is a twin-track version of river routing. It may use short jumpers to jump tracks. Other templates and hybrid patterns may also be considered. These may be in all possible permutations of net order and track order. Typically, total number of such permutations is reasonably small and can be quickly evaluated for a reasonably sized bump group. If routing engine finds a valid solution, it checks solution for completeness criteria and quality of result criteria. Completeness criteria checks number of nets successfully routed, and number of nets not routed, if any. Quality of result criteria looks at number of nets routed on single layer vs. number of nets routed on two or more layers, and number of vias used.

If both completeness criteria and quality of result criteria are acceptable, then current result is saved as best result, and routing engine continues to next bump group. The routing engine is adaptive in nature—it learns the successful routing results and assigns higher precedence to such recipes during future evaluation of similar bump groups. It also caches the best result obtained in prior bump groups. When a similar bump group is evaluated in future, it compares the current result with previous best result. If current result matches prior best result, it accepts current result as final assuming user has not specified exhaustive evaluation mode.

If either completeness criteria or quality of result criteria do not pass, then current result is compared to prior cached result, and the better result is cached. However, routing engine continues evaluation on current bump group applying remaining permutation of route topology, net/track assignment order and other configurable parameters.

Step 225: Exception Handling

Exception handling refers to cases where a legal solution is not found based on original requirements, for example constraints on coaxial shielding and length matching. In such cases, a specified number of nets can be routed with controlled relaxation of route requirements. A few examples of such exception handling are described below:

Layer jumping for short lengths—In a few situations, routing engine determines that no legal track is available to route signal in given direction. This may occur due to either fewer tracks available than required, or blockage of few tracks due to say, bump cluster, C4 or other design considerations. In such situation, the routing methodology may be allowed to use shield track for signal. Technically, such use violates the co-axial shielding requirement and hence, such usage is classified under exception handling. Routing methodology provides user control for exception handling both in terms of the number of nets that can use this exception, and what is the maximum route length for which such an exception can be used.

Length matching requirement—In a few situations, routing engine can find a solution only if length matching requirement is not enforced for a select few nets. An example of such a situation is loopback nets, where tracks may be available for direct route, but not for loopback route. Routing methodology provides user control of which nets can bypass length matching requirement, and maximum allowed variance between actual route length vs. desired length-matched length.

Routing methodology leverages exception handling function as a last resort, and only to the extent allowed by user-specification. It also generates a detailed report for all cases where exception handling is used, so that user is aware of and agrees with exception handling tradeoffs.

Step 226: PG Shielding and PG Hookup

When signal routing is completed for all unique bump groups, then routing methodology adds shielding and PG (power and ground) hookup routes for these bump groups.

Shield routes are created on shielding tracks available as per initial track planning. However, routing methodology ensures that shield routes do not interfere with signal routes in cases where an exception has been applied to route signal on a shield track.

PG hookup is performed after both signal routes and shield routes have been created. Normally the PG planning is done for the complete interposer and uses gap between bump groups. Routing methodology enables PG hookup by ensuring that access to PG and shield routes is clearly defined on each unique bump group's boundary.

Step 227: Cloning

Route cloning is the final step in completing the interposer routing methodology. Prior to executing the route cloning step, user can optionally review and fine-tune the routes for overall design consideration (step 227A). In general, there is no restriction in terms of what user can modify in the already routed unique bump group results. Routing methodology assumes that user modification of the routing does not invalidate the route result suitability for cloning. At a high level, the following conditions should continue to be met after user modifications, if any:

1. Placement of non-RDL vias—Placement of non-RDL vias that connect to RDL via should be unchanged. This ensures consistency of non-RDL via location between a unique bump group and all its duplicate bump groups. If the non-RDL via location is changed, it will invalidate the unique-to-duplicate relationship computed during step 223.
2. Signal routes are fully contained in bounding box determined by non-RDL via placement. This routing methodology does not enforce relative ordering of unique bump groups vis-à-vis those of duplicate bump groups. Hence, even if spare track or space is available outside the non-RDL via bounding box of a unique bump group, such may not be the case for all its duplicate (clone) bump groups.
3. Route cloning is not performed for nets which were routed in a bump group as post-processing step. See section 221 for which nets are handled as post-processing nets rather than native nets of a unique bump group. Routing methodology does not enforce match for such nets when detecting unique vs. clone bump groups. Hence, number and location of post-processed nets may differ between a unique bump group and its clone bump groups. In general, post-processed nets will be routed individually for each bump group, and hence, are not covered by route cloning step.
4. Stub routing is handled slightly differently than other route shapes. If routing methodology detects consistent orthogonal spacing between track plan and non-RDL via placement for a unique bump group as its clone bump groups, then stub routes are cloned as any other route shape. However, if it detects variance for required stub-length between unique bump group and its clone bump group, it performs stub-route length adjustment for each clone bump group.

Step 231: Design Completion (RDL Routing)

Note, the RDL routing step is independent of this routing methodology and can be performed either during interposer design preparation (if RDL via is preplaced), or any time after the RDL via has been placed by this routing methodology. Note, route cloning will not be used for cloning RDL routes because bump placement may not follow exact same spacing requirement as required for RDL via and non-RDL via placement.

Step 232: Design Completion (Package Routing)

C4 (or other package) routing may be performed to connect external nets (bumps) to package.

Step 233: Design Completion (DRC Check)

After route cloning step is complete, user performs design rule check on complete interposer design to ensure correctness of routed design.

Figure 4:
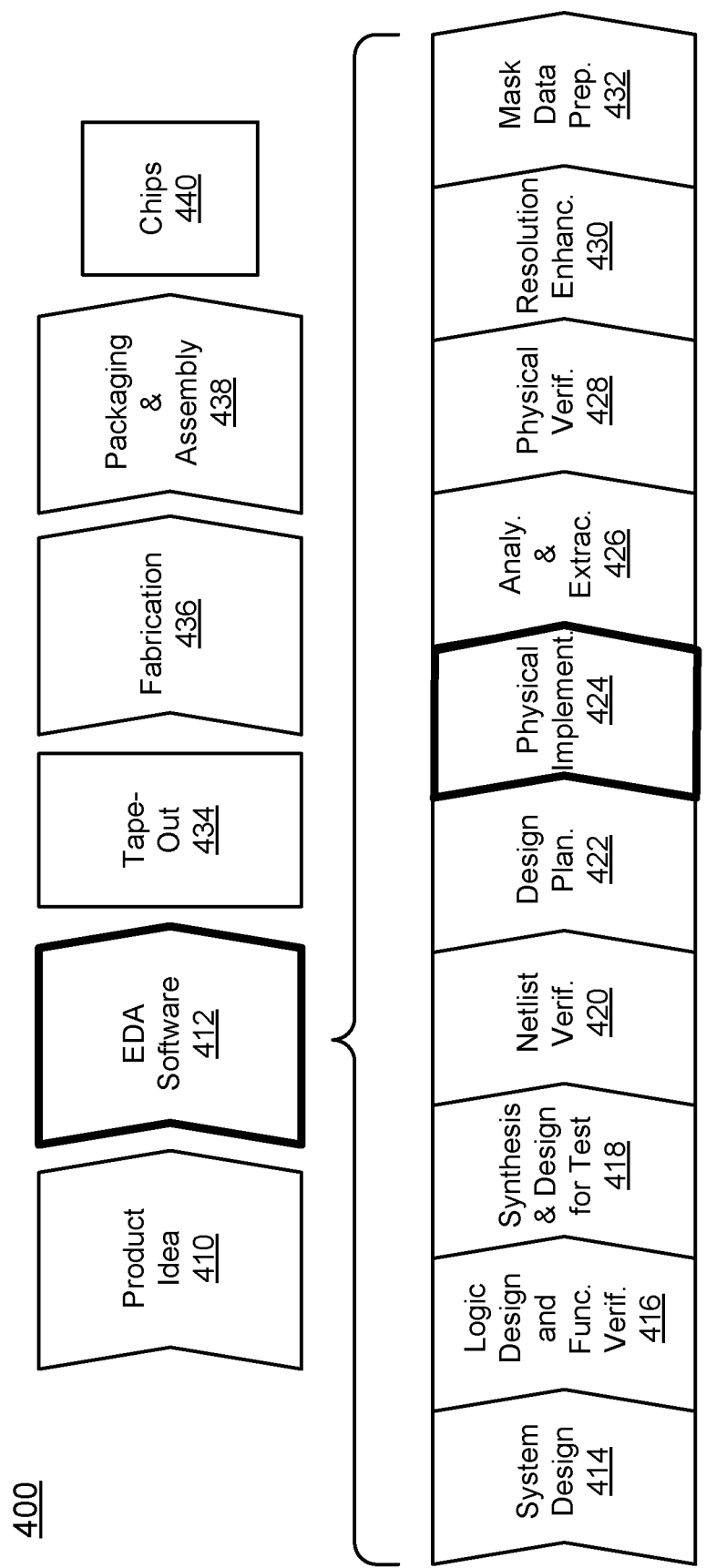
FIG. 4 is a flow diagram illustrating various operations in the design and fabrication of an integrated circuit.

For context, FIG. 4 illustrates various processes performed in the design and fabrication of an integrated circuit using software tools with a computer to transform data and instructions that represent the integrated circuit. These processes start with the generation of a product idea 410 with information supplied by a designer and is realized during a design process that uses EDA software tools 412, which may also be signified herein as EDA software, as a design tool or a verification tool. When the design is finalized, it can be taped-out 434. After tape-out, a semiconductor die is fabricated 436 and packaging and assembly processes 438 are performed, which result in the finished integrated circuit 440 which may also be signified herein as a circuit, device, component, chip or SoC (system on chip).

Note that the design process that uses EDA software tools 412 includes operations 414-432, which are described below. This design flow description is for illustration purposes only and is not meant to limit the present disclosure. For example, an actual integrated circuit design may require a designer to perform the design operations in a different sequence than the sequence described herein.

During system design 414, a designer describes the functionality to be manufactured. The designer can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect, Saber, System Studio, and Designware products.

Then, during logic design and functional verification 416, VHDL or Verilog code for modules in the circuit is written and the design is checked for functional accuracy. More specifically, the design is checked to ensure that it produces the correct outputs. The VHDL or Verilog code is software comprising optimized readable program instructions adapted for the efficient description of a logic design. Exemplary EDA software products from Synopsys, Inc. of Mountain View, Calif. that can be used at this stage include: VCS, Vera, Designware, Magellan, Formality, ESP and Leda products.

Next, during synthesis and design for test 418, VHDL/Verilog code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

Moreover, during netlist verification 420, the netlist is checked for compliance with timing constraints and for correspondence with the VHDL/Verilog code. Exemplary EDA software products from Synopsys, Inc. of Mountain View, Calif. that can be used at this stage include: Formality, Primetime, and VCS products.

Furthermore, during design planning 422, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

Additionally, during physical implementation 424, the placement positioning of circuit elements such as transistors or capacitors and routing connection of the same by a plurality of conductors occurs. Exemplary EDA software products from Synopsys, Inc. of Mountain View, Calif. that can be used at this stage include: the Astro and IC Compiler products.

Then, during analysis and extraction 426, the circuit function is verified at a transistor level, which permits refinement of the logic design. Exemplary EDA software products from Synopsys, Inc. of Mountain View, Calif. that can be used at this stage include: Astrorail, Primerail, Primetime, and Star RC/XT products.

Next, during physical verification 428, the design is checked to ensure correctness for manufacturing issues, electrical issues, lithographic issues, and circuitry. Exemplary EDA software products from Synopsys, Inc. of Mountain View, Calif. that can be used at this stage include the Hercules product.

Moreover, during resolution enhancement 430, geometric manipulations of the layout are performed to improve manufacturability of the design. Exemplary EDA software products from Synopsys, Inc. of Mountain View, Calif. that can be used at this stage include: Proteus, Proteus, and PSMGED products.

Additionally, during mask-data preparation 432, the "tape-out" data for production of masks to produce finished integrated circuits is provided. Exemplary EDA software products from Synopsys, Inc. of Mountain View, Calif. that can be used at this stage include the Cats. family of products.

For all the above mentioned integrated circuit design tools, similar tools from other EDA vendors, such as Cadence and Mentor Graphics, can be used as an alternative. Additionally, similarly non-commercial tools available from universities can be used.

A storage subsystem is preferably used to store the basic programming and data constructs that provide the functionality of some or all the EDA tools described herein, and tools applied for development of cells for the library and for physical and logical design using the library. These software modules are generally executed by one or more processors in a manner known to those of ordinary skill in the art.

Embodiments of the present disclosure can be used during one or more of the above-described stages. Specifically, some embodiments of the present disclosure can be used in EDA software 412 as a part of physical implementation 424. The flow shown in FIG. 4 may be applied to each individual die (top dies and interposer die) and also to the overall multichip module.

Figure 5:
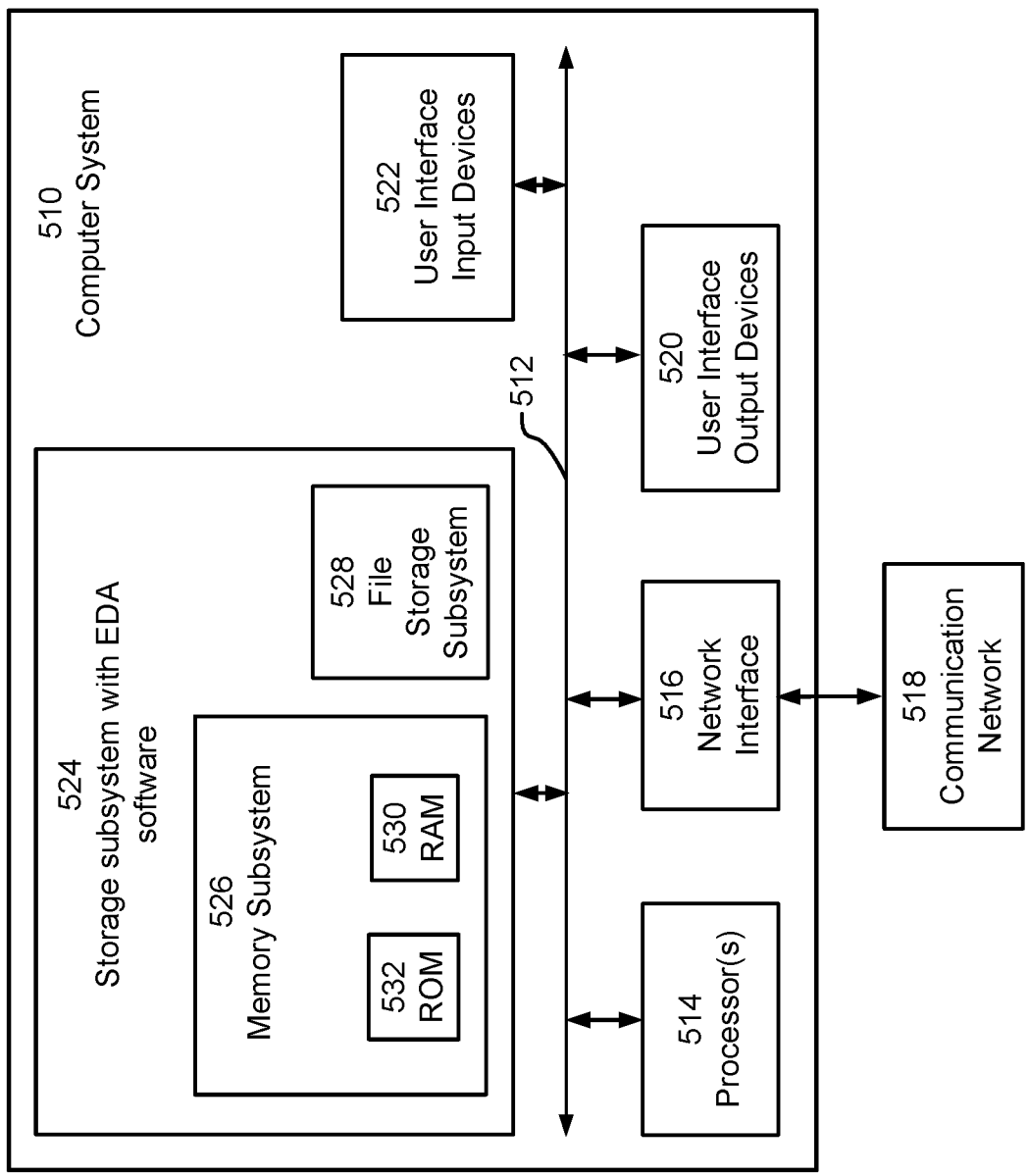
FIG. 5 is a block diagram of one embodiment of a computer system that may be used with the present invention.

FIG. 5 is a block diagram of one embodiment of a computer system 510 that may be used with the present invention. The computer system 510 typically includes at least one computer or processor 514 which communicates with peripheral devices via bus subsystem 512. Typically, the computer can include, or the processor can be, any of a microprocessor, graphics processing unit, or digital signal processor, and their electronic processing equivalents, such as an Application Specific Integrated Circuit (ASIC) or Field Programmable Gate Array (FPGA). The terms "processor" and "computer" are further defined below. These peripheral devices may include a storage subsystem 524, comprising a memory subsystem 526 and a file storage subsystem 528, user interface input devices 522, user interface output devices 520, and a network interface subsystem 516. The input and output devices allow user interaction with computer system 510.

The computer system may be a server computer, a client computer, a workstation, a mainframe, a personal computer (PC), a tablet PC, a rack-mounted "blade" or any data processing machine capable of executing instructions (sequential or otherwise) that specify actions to be taken by that machine.

The computer system typically includes an operating system, such as Microsoft's Windows, Sun Microsystems's Solaris, Apple Computer's MacOs, Linux or Unix. The computer system also typically can include a Basic Input/Output System (BIOS) and processor firmware. The operating system, BIOS and firmware are used by the processor to control subsystems and interfaces connected to the processor. Typical processors compatible with these operating systems include the Pentium and Itanium from Intel, the Opteron and Athlon from Advanced Micro Devices, and the ARM processor from ARM Holdings.

Innovations, embodiments and/or examples of the claimed inventions are neither limited to conventional computer applications nor the programmable apparatus that run them. For example, the innovations, embodiments and/or examples of what is claimed can include an optical computer, quantum computer, analog computer, or the like. The computer system may be a multi-processor or multi-core system and may use or be implemented in a distributed or remote system. The term "processor" here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions to perform any one or more of the operations discussed herein. Due to the ever-changing nature of computers and networks, the description of computer system 510 depicted in FIG. 5 is intended only as one example for purposes of illustrating the preferred embodiments. Many other configurations of computer system 510 are possible having more or less components than the computer system depicted in FIG. 5.

Network interface subsystem 516 provides an interface to outside networks, including an interface to communication network 518, and is coupled via communication network 518 to corresponding interface devices in other computer systems or machines. Communication network 518 may comprise many interconnected computer systems, machines and communication links. These communication links may be wireline links, optical links, wireless links, or any other devices for communication of information. Communication network 518 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 522 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term "input device" is intended to include all possible types of devices and ways to input information into computer system 510 or onto communication network 518. User interface input devices typically allow a user to select objects, icons, text and the like that appear on some types of user interface output devices, for example, a display subsystem.

User interface output devices 520 may include a display subsystem, a printer, or non-visual displays such as audio output devices. The display subsystem may include a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term "output device" is intended to include all possible types of devices and ways to output information from computer system 510 to the user or to another machine or computer system.

Memory subsystem 526 typically includes a number of memories including a main random-access memory (RAM) 530 (or other volatile storage device) for storage of instructions and data during program execution and a read only memory (ROM) 532 in which fixed instructions are stored. File storage subsystem 528 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 528.

Bus subsystem 512 provides a device for letting the various components and subsystems of computer system 510 communicate with each other as intended. Although bus subsystem 512 is shown schematically as a single bus, alternative embodiments of the bus subsystem may use multiple busses. For example, RAM-based main memory can communicate directly with file storage systems using Direct Memory Access (DMA) systems.

As used herein, the term "module" signifies a tangible data and information processing device, that typically is limited in size and/or complexity. For example, the term "module" can signify one or more methods or procedures that can transform data and information. The term "module" can also signify a combination of one or more methods and procedures in a computer program. The term "module" can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilink or Intel's Altera), Random Access Memories (RAMs) or microprocessors. A module is configured to process data and information, typically using a sequence transformations (also referred to as "operations") applied to the data and information (or in the case of ROMs and RAMS, transforming data and information by using the input information as an address for memory that stores output data and information), to perform aspects of the present innovations, embodiments and/or examples of the invention.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The "substance" of a module's processing is independent of the form in which it is manufactured or implemented.

As used herein, the term "algorithm" signifies a process comprising a sequence or set of operations or instructions that a module can use to transform data and information to achieve a result. A module can comprise one or more algorithms. As used herein, the term "thread" refers to a sequence of instructions that can comprise a subset of the instructions of an entire process or algorithm. A process or algorithm can be partitioned into multiple threads that can be executed in parallel.

As used herein, the term "computer" includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term "software" or "program" signifies one or more algorithms and data structures that configure a processor for use in the innovations, embodiments and examples described in this specification. Such devices configurable by software include one or more computers, for example, standalone, client or server computers, or one or more hardware modules, or systems of one or more such computers or modules. As used herein, the term "software application" signifies a set of data and instructions that configure the processor to achieve a specific result, for example, to perform word processing operations, or to encrypt a set of data.

As used herein, the term "programming language" signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the "C" programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software, or has an interface device that receives the software over a network.

Although the detailed description contains many specifics, these should not be construed as limiting the scope of the invention but merely as illustrating different examples. It should be appreciated that the scope of the disclosure includes other embodiments not discussed in detail above. Various other modifications, changes and variations which will be apparent to those skilled in the art may be made in the arrangement, operation and details of the method and apparatus disclosed herein without departing from the spirit and scope as defined in the appended claims. Therefore, the scope of the invention should be determined by the appended claims and their legal equivalents.

What is claimed is:

1. A method for routing signal nets through an interposer die, the method implemented on a computer system executing instructions comprising:

accessing a design for a multichip module, the multichip module comprising a plurality of die containing circuitry interconnected through an interposer die, the design for the multichip module specifying (a) locations of a plurality of bumps on an RDL layer of the interposer, (b) a plurality of signal nets to be routed through the interposer, each signal net connecting two of the bumps on the RDL layer of the interposer, and (c) one or more length-matching constraints, each length-matching constraint specifying that two or more of the signal nets must be length-matched;

assigning the signal nets and their corresponding bumps to bump groups, based on a relative locations of the bumps and also based on the length-matching constraints;

identifying bump groups that are clones wherein, in order for a first bump group and a second bump group to be clones, (x) the bumps in the first bump group must have a same relative position as the bumps in the second bump group, and (y) the signal nets in the first bump group must be subject to the same length-matching constraint as the signal nets in the second bump group; and for each set of two or more bump group clones, determining a routing through the interposer for one of the bump group clones in the set, and replicating the routing through the interposer for the other bump group clones in the set.

2. The computer-implemented method of claim 1 wherein, for each bump group, all signal nets in that bump group are subject to a same length-matching constraint.

3. The computer-implemented method of claim 2 wherein determining the routing through the interposer for one of the bump group clones comprises selecting from a predefined set of routing templates where each of the routing templates satisfies the length-matching constraint.

4. The computer-implemented method of claim 3 wherein the predefined set of routing templates include templates based on a river-routing pattern, a loopback routing pattern, and an orthogonal U-turn routing pattern.

5. The computer-implemented method of claim 1 wherein the interproser comprises a plurality of routing layers with tracks; routing through the interposer is along the tracks; and, in order for a first bump group and a second bump group to be clones, (z) track availability for routing the signal nets in the first bump group must be the same as track availability for routing the signal nets in the second bump group.

6. The computer-implemented method of claim 1 wherein, for each bump group, all signal nets in that bump group have a same orientation as defined by the relative positions of the two bumps connected by the signal net.

7. The computer-implemented method of claim 6 wherein assigning the signal nets and their corresponding bumps to bump groups comprises:

determining an orientation for each signal net from a set of predefined orientations; and for each of the predefined orientations, assigning the signal nets with that orientation to bump groups.

8. The computer-implemented method of claim 7 wherein the predefined orientations include a horizontal orientation, a vertical orientation, an offset horizontal orientation, and an offset vertical orientation.

9. The computer-implemented method of claim 1 wherein at least one set of bump group clones includes at least 10 bump group clones in the set, and at least 10 signal nets in the bump group.

10. The computer-implemented method of claim 1 wherein a majority of the signal nets are inter-die nets.

11. The computer-implemented method of claim 1 wherein the routing for a majority of the signal nets has a length of at least 10% of a width of the top die.

12. The computer-implemented method of claim 1 wherein the interproser comprises a plurality of routing layers with tracks, routing through the interposer is along the tracks, and the routing occupies at least 90% of the tracks.

13. The computer-implemented method of claim 1 wherein the multichip modules comprises an array of units of a same die arranged in a scalable architecture.

14. The computer-implemented method of claim 1 wherein the interproser comprises a plurality of routing layers with tracks and routing through the interposer is along the tracks, the method further comprising:

placing RDL vias that connect the RDL layer of the interposer with the routing layers of the interposer.

15. The computer-implemented method of claim 14 wherein the RDL vias are placed, subject to increasing the routing of signal nets in a single routing layer.

16. The computer-implemented method of claim 14 wherein the RDL vias are placed, subject to increasing track availability for routing the signal nets.

17. The computer-implemented method of claim 1 further comprising:

exception handling for signal nets that are not successfully routed.

18. The computer-implemented method of claim 1 wherein the interposer comprises a plurality of routing layers with tracks and routing through the interposer is along the tracks, some of the signal nets require shielding, and routing of the signal nets that require shielding comprises reserving adjacent tracks for the shielding.

19. A method for routing signal nets through an interposer die, the method implemented on a computer system executing instructions comprising:

accessing a design for a multichip module, the multichip module comprising a plurality of die containing circuitry interconnected through an interposer die, the design for the multichip module specifying (a) locations of a plurality of bumps on an RDL layer of the interposer, (b) a plurality of signal nets to be routed through the interposer, each signal net connecting two of the bumps on the RDL layer of the interposer, and (c) one or more length-matching constraints, each length-matching constraint specifying that two or more of the signal nets must be length-matched;

determining an orientation for each signal net from a set of predefined orientations, the orientation defined by the relative positions of the two bumps connected by the signal net;

for each of the predefined orientations, assigning the signal nets with that orientation to bump groups, and wherein all signal nets in a bump group are subject to the same length-matching constraint;

identifying bump groups that are clones wherein, in order for a first bump group and a second bump group to be clones, (x) the bumps in the first bump group must have a same relative position as the bumps in the second bump group, (y) the signal nets in the first bump group must be subject to the same length-matching constraint as the signal nets in the second bump group, and (z)

track availability for routing the signal nets in the first bump group must be the same as track availability for routing the signal nets in the second bump group; and for each set of two or more bump group clones:
determining a routing through the interposer for one of the bump group clones in the set, by selecting from a predefined set of routing templates where each of the routing templates satisfies the length-matching constraint for that bump group clone; and replicating the routing through the interposer for the other bump group clones in the set.

20. A non-transitory computer-readable storage medium storing executable computer program instructions for routing signal nets through an interposer die, the instructions executable by a processor and causing the processor to perform a method comprising:

accessing a design for a multichip module, the multichip module comprising a plurality of die containing circuitry interconnected through an interposer die, the design for the multichip module specifying (a) locations of a plurality of bumps on an RDL layer of the interposer, (b) a plurality of signal nets to be routed through the interposer, each signal net connecting two of the bumps on the RDL layer of the interposer, and (c) one or more length-matching constraints, each length-matching constraint specifying that two or more of the signal nets must be length-matched;

assigning the signal nets and their corresponding bumps to bump groups, based on a relative locations of the bumps and also based on the length-matching constraints;

identifying bump groups that are clones wherein, in order for a first bump group and a second bump group to be clones, (x) the bumps in the first bump group must have a same relative position as the bumps in the second bump group, and (y) the signal nets in the first bump group must be subject to the same length-matching constraint as the signal nets in the second bump group; and for each set of two or more bump group clones, determining a routing through the interposer for one of the bump group clones in the set, and replicating the routing through the interposer for the other bump group clones in the set.

* * * * *